United States Patent
Wu et al.

(10) Patent No.: US 11,605,605 B2
(45) Date of Patent: Mar. 14, 2023

(54) REDISTRIBUTION LAYER (RDL) STRUCTURE, SEMICONDUCTOR DEVICE AND MANUFACTURING METHOD THEREOF

(71) Applicant: Changxin Memory Technologies, Inc., Anhui (CN)

(72) Inventors: Ping-Heng Wu, Hefei (CN); Wen Hao Hsu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 68 days.

(21) Appl. No.: 17/220,860

(22) Filed: Apr. 1, 2021

(65) Prior Publication Data
US 2021/0225787 A1 Jul. 22, 2021

Related U.S. Application Data

(63) Continuation of application No. PCT/CN2019/113589, filed on Oct. 28, 2019.

(30) Foreign Application Priority Data

Nov. 15, 2018 (CN) .......................... 201811361058.3
Nov. 15, 2018 (CN) .......................... 201821885774.7

(51) Int. Cl.
*H01L 23/00* (2006.01)

(52) U.S. Cl.
CPC .............. *H01L 24/05* (2013.01); *H01L 24/03* (2013.01); *H01L 24/48* (2013.01);
(Continued)

(58) Field of Classification Search
CPC ......... H01L 24/05; H01L 24/03; H01L 24/48; H01L 2224/02125; H01L 2224/0214;
(Continued)

(56) References Cited

U.S. PATENT DOCUMENTS 7,741,714 B2 6/2010 Huang et al.
9,053,973 B2 6/2015 Sawada et al.
(Continued)

FOREIGN PATENT DOCUMENTS

CN 1770437 A 5/2006
CN 101630645 A 1/2010
(Continued)

OTHER PUBLICATIONS

PCT International Search Report and the Written Opinion dated Feb. 11, 2020, issued in related International Application No. PCT/CN2019/113589 (8 pages).

*Primary Examiner* — Douglas W Owens
(74) *Attorney, Agent, or Firm* — Sheppard Mullin Richter & Hampton LLP

(57) ABSTRACT

The present disclosure provides a redistribution layer (RDL) structure, a semiconductor device and manufacturing method thereof. The semiconductor device comprising an RDL structure that may include a substrate, a first conductive layer, a reinforcement layer and, and a second conductive layer. The first conductive layer may be formed on the substrate and has a first bond pad area. The reinforcement layer may be formed on a surface of the first conductive layer facing away from the substrate and located in the first bond pad area. The second conductive layer may be formed on the reinforcement layer and an area of the first conductive layer not covered by the reinforcement layer. The reinforcement layer has a material strength greater than those of the first conductive layer and the second conductive layer.

20 Claims, 6 Drawing Sheets

(52) U.S. Cl.
CPC .............. *H01L 2224/0214* (2013.01); *H01L 2224/0215* (2013.01); *H01L 2224/0218* (2013.01); *H01L 2224/02125* (2013.01); *H01L 2224/02145* (2013.01); *H01L 2224/02185* (2013.01); *H01L 2224/0391* (2013.01); *H01L 2224/04042* (2013.01); *H01L 2224/05008* (2013.01); *H01L 2224/05073* (2013.01); *H01L 2224/05548* (2013.01); *H01L 2224/05573* (2013.01); *H01L 2224/48463* (2013.01); *H01L 2924/01022* (2013.01); *H01L 2924/01073* (2013.01); *H01L 2924/01074* (2013.01); *H01L 2924/04941* (2013.01); *H01L 2924/04953* (2013.01)

(58) Field of Classification Search
CPC ... H01L 2224/02145; H01L 2224/0215; H01L 2224/0218; H01L 2224/02185; H01L 2224/0391; H01L 2224/04042; H01L 2224/05008; H01L 2224/05073; H01L 2224/05548; H01L 2224/05573; H01L 2224/48463; H01L 2924/01022; H01L 2924/01073; H01L 2924/01074; H01L 2924/04941; H01L 2924/04953; H01L 2224/05181; H01L 2224/02321; H01L 2224/02331; H01L 2224/0235; H01L 2224/0239; H01L 2224/0383; H01L 2224/05017; H01L 2224/05088; H01L 2224/05124; H01L 2224/05166; H01L 2224/05184; H01L 2224/05557; H01L 2224/05559; H01L 2224/05624; H01L 2224/05686; H01L 2224/85201; H01L 24/02; H01L 23/525

See application file for complete search history.

(56) References Cited

U.S. PATENT DOCUMENTS

| | | |
|---|---|---|
| 10,504,867 B2 | 12/2019 | Shimazaki |
| 2002/0034871 A1 | 3/2002 | Chittipeddi et al. |
| 2018/0158789 A1* | 6/2018 | Yu .......................... H01L 24/27 |
| 2021/0057352 A1* | 2/2021 | Agarwal ............ H01L 23/5389 |

FOREIGN PATENT DOCUMENTS

| | | |
|---|---|---|
| CN | 103915399 A | 7/2014 |
| CN | 106328626 A | 1/2017 |
| CN | 209119090 U | 7/2019 |
| JP | 2015-053371 A | 3/2015 |

\* cited by examiner

REDISTRIBUTION LAYER (RDL) STRUCTURE, SEMICONDUCTOR DEVICE AND MANUFACTURING METHOD THEREOF

CROSS-REFERENCE TO RELATED APPLICATIONS

This application is a continuation application of International Patent Application No. PCT/CN2019/113589, filed on Oct. 28, 2019, which is based on and claims priority to and benefits of the Chinese Patent Applications No. 201811361058.3 and No. 201821885774.7, both filed with the China National Intellectual Property Administration (CNIPA) of the People's Republic of China on Nov. 15, 2018. The entire contents of the above-referenced applications are incorporated herein by reference.

TECHNICAL FIELD

The present disclosure relates to a technical field of semiconductors, and in particular to a structure of a redistribution layer (RDL), a semiconductor device and a manufacturing method thereof.

BACKGROUND

RDL technology is the technology of redistributing input/output ports of an integrated circuit (IC) chip and other semiconductor devices for different encapsulations of the chip. When connecting circuits, an RDL is often subjected to a wire bonding, such as a pressure bonding.

However, during the pressure bonding, a bond ball may impact the RDL, so that a section of a pressure bonding part of the RDL may move outwards and the bond ball may directly impact a substrate, resulting in crack or deformation of the substrate and circuit short and failure caused thereby. Conventionally, in order to improve the capability of the RDL to resist the impact of the bond ball, thickness of the RDL is increased. Nonetheless, such a thickness increase will generate a parasitic capacitance and affect the performance of a circuit.

It is to be noted that the information disclosed in the above Background section is merely for enhancing the understanding of the background of the present disclosure and thus may include information that does not constitute as prior art known to a person of ordinary skill in the art.

SUMMARY

The present disclosure provides an RDL structure, a semiconductor device and a manufacturing method thereof, to prevent damages of a substrate due to wire bonding and to improve the performance of the semiconductor device having the said RDL structure.

One aspect of the present disclosure may be directed to an RDL structure, including: a substrate; a first conductive layer formed on the substrate and having a first bond pad area; a reinforcement layer formed on a surface of the first conductive layer facing away from the substrate and located in the first bond pad area; and a second conductive layer formed on the reinforcement layer and an area of the first conductive layer not covered by the reinforcement layer. The reinforcement layer may have a material strength greater than that of the first conductive layer and the second conductive layer and the reinforcement layer is conductive.

In an exemplary embodiment of the present disclosure, the reinforcement layer may have at least one first through via; and the second conductive layer fills the at least one first through via and is connected to the first conductive layer.

In an exemplary embodiment of the present disclosure, a plurality of first through vias may be provided, and the plurality of first through vias may be distributed at intervals along an annular track.

In an exemplary embodiment of the present disclosure, the material of the reinforcement layer may include at least one of metals and metal nitrides.

In an exemplary embodiment of the present disclosure, the material of the reinforcement layer may include at least one of tungsten, titanium, tantalum, titanium nitride, and tantalum nitride.

In an exemplary embodiment of the present disclosure, edges of orthographic projections of the first conductive layer, the reinforcement layer, and the second conductive layer on the substrate may be located inside an edge of the substrate.

In an exemplary embodiment of the present disclosure, the first conductive layer may have a first sunken portion located out of the second bond pad area and sinking towards the substrate. The second conductive layer may have a second bond pad area and a second sunken portion. The second bond pad area may be right directed to the reinforcement layer, and the second sunken portion may be located at a position of the first sunken portion and sinks towards the first conductive layer.

In an exemplary embodiment of the present disclosure, a depth of the second sunken portion may range from 0.05 µm to 0.5 µm.

In an exemplary embodiment of the present disclosure, the RDL structure may further include a passivation layer covering the second conductive layer and having a second through via. The second through via may expose an area of the second conductive layer right directed to the reinforcement layer.

One aspect of the present disclosure may be directed to a manufacturing method of an RDL structure, including: providing a substrate; forming a first conductive layer on the substrate, the first conductive layer having a first bond pad area; forming a reinforcement layer on a surface of the first conductive layer facing away from the substrate, the reinforcement layer being located in the first bond pad area; and forming a second conductive layer, the second conductive layer covering the reinforcement layer and an area of the first conductive layer not covered by the reinforcement layer. The reinforcement layer may have a material strength greater than that of the first conductive layer and the second conductive layer and the reinforcement layer is conductive.

In an exemplary embodiment of the present disclosure, forming a reinforcement layer on a surface of the first conductive layer facing away from the substrate and the reinforcement layer being located in the first bond pad area may further include: forming a reinforcement material layer on the surface of the first conductive layer facing away from the substrate; and removing a section of the reinforcement material layer located out of the first bond pad area, and forming a first sunken portion on the first conductive layer exposed by the reinforcement material layer.

In an exemplary embodiment of the present disclosure, the second conductive layer may sink into the first sunken portion at a position of the first sunken portion to form a second sunken portion.

In an exemplary embodiment of the present disclosure, the manufacturing method may further include removing sections at edges of the first conductive layer, the reinforcement layer, and the second conductive layer. The edges of orthographic projections of the first conductive layer, the reinforcement layer, and the second conductive layer on the substrate may be located inside an edge of the substrate.

In an exemplary embodiment of the present disclosure, the manufacturing method may further include forming a passivation layer to cover the second conductive layer. The passivation layer may have a second through via, and the second through via may expose an area of the second conductive layer right directed to the reinforcement layer.

One aspect of the present disclosure may be directed to a semiconductor manufacturing method comprising the above RDL structure method described in any one of the above embodiments.

One aspect of the present disclosure may be directed to a semiconductor device including the above RDL structure and manufactured by the above semiconductor manufacturing method in any one of the above embodiments.

According to the RDL structure, the semiconductor device and the manufacturing method thereof disclosed in the present disclosure, a reinforcement layer is provided between a first conductive layer and a second conductive layer, and the reinforcement layer has a strength greater than that of the first conductive layer and the second conductive layer. The reinforcement layer may buffer the impact of a bond ball. Therefore, the capability of an RDL to resist the impact of the bond ball may be improved, and damages of a substrate caused by the impact can be prevented to avoid a circuit short. Furthermore, due to the presence of the reinforcement layer, the thicknesses of the first conductive layer and the second conductive layer may be reduced, and thus the thickness of the RDL may be reduced on the premise of guaranteeing the impact resistance, resulting in a lower parasitic capacitance and improvement of the performance of the semiconductor device.

It is to be understood that both the foregoing general description and the following detailed description are exemplary and explanatory only and are not necessarily restrictive to the present disclosure.

BRIEF DESCRIPTION OF DRAWINGS

The accompanying drawings, which are incorporated in and constitute a part of the specification, illustrate embodiments of the present disclosure and together with the specification, serve to explain the principles of the present disclosure. Apparently, the accompanying drawings in the following description only illustrate some of the embodiments of the present disclosure, and a person of ordinary skill in the art can derive other drawings from the accompanying drawings without creative efforts.

NUMERALS IN THE DRAWINGS

Figure 1:
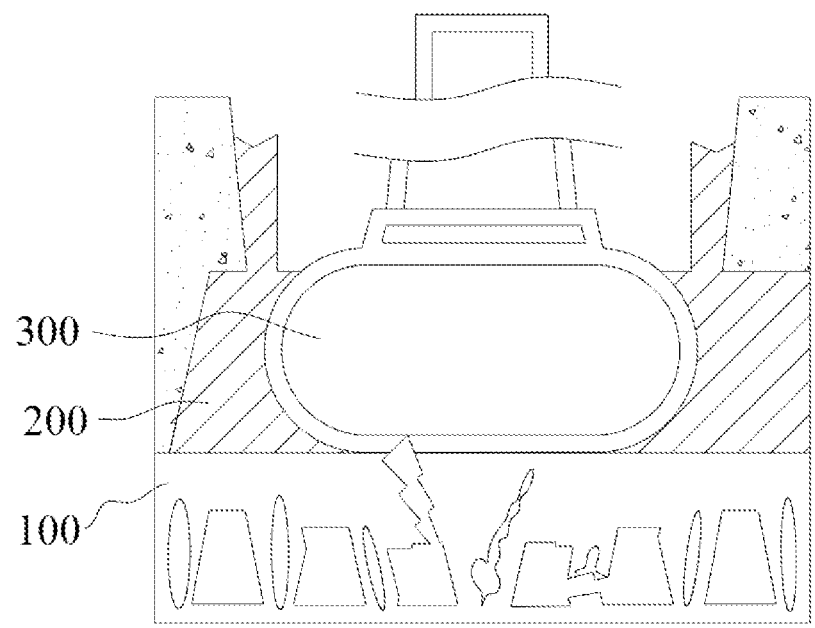
FIG. 1 is a schematic diagram of an RDL structure during wire bonding in related art.

100: substrate,
200: conductive layer,
300: bond ball,
1: substrate,
101: electronic device,
102: air gap,
2: first conductive layer,
21: first sunken portion,
3: reinforcement layer,
3$a$: reinforcement material layer,
31: first through via,
32: buffer portion,
4: second conductive layer,
41: second sunken portion,
5: passivation layer,
51: second through via,
6: bond ball,
1$a$: bond pad portion, and
2$a$: wire portion.

DETAIL DESCRIPTION

The exemplary embodiments will be described more completely in conjunction with the accompanying drawings. However, the exemplary embodiments can be implemented in various forms, and should not be understood as being limited to the embodiments described herein. Instead, these embodiments are provided to make the present disclosure thorough and complete, and fully convey the concepts of the exemplary embodiments to the person skilled in the art. Identical numerals in the drawings represent an identical or similar structure and thus the detailed descriptions thereof are omitted.

Although relative terms are used in the specification, for example, "on" and "under" are used to describe a relative relationship of one numeral component to another component, these terms used in the specification are merely for the convenience, for instance, according to an exemplary direction in the drawings. It is to be understood that if a numeral apparatus is reversed to turn upside down, a component described to be "on" will become a component to be "under". When a structure is "on" other structure, it may be indicated that the structure is integrally formed on the other structure, or indicated that the structure is "directly" disposed on the other structure, or indicated that the structure is "indirectly" disposed on the other structure via another structure.

Terms "a", "an", "one", "the", "said" and "at least one" are used to represent one or more elements/compositional portions/and the like. Terms "include", "including", "comprise", "comprising", "has" and "having" are used to represent a meaning of open inclusion and refer to that another elements/compositional portions/and the like may further be present besides the listed elements/compositional portions/ and the like. The terms "first", "second", "third" and the like are merely used as numerals rather than limits to the number of objects thereof.

In the related art, as shown in FIG. 1, an RDL structure may include a substrate 100, and a conductive layer 200 formed on the substrate 100. The conductive layer 200 is the RDL and has a bond pad portion and a wire portion connected to a bond pad. During wire bonding, a bond ball 300 may impact the bond pad portion of the conductive layer 200. If the thickness of the conductive layer 200 is small, it is easy for the bond ball 300 to directly impact the substrate 100 to cause crack or deformation of the substrate 100, resulting in circuit short and failure. If the thickness of the conductive layer 200 is large, a parasitic capacitance is produced to affect the performance of the circuit.

An embodiment of the present disclosure provides an RDL structure, which may be applied to a semiconductor device. The semiconductor device may be an integrated circuit (IC) chip, and the chip may be a memory, a processor, and the like. Certainly, the semiconductor device may be other integrated circuits, which will not be listed herein.

Figure 2:
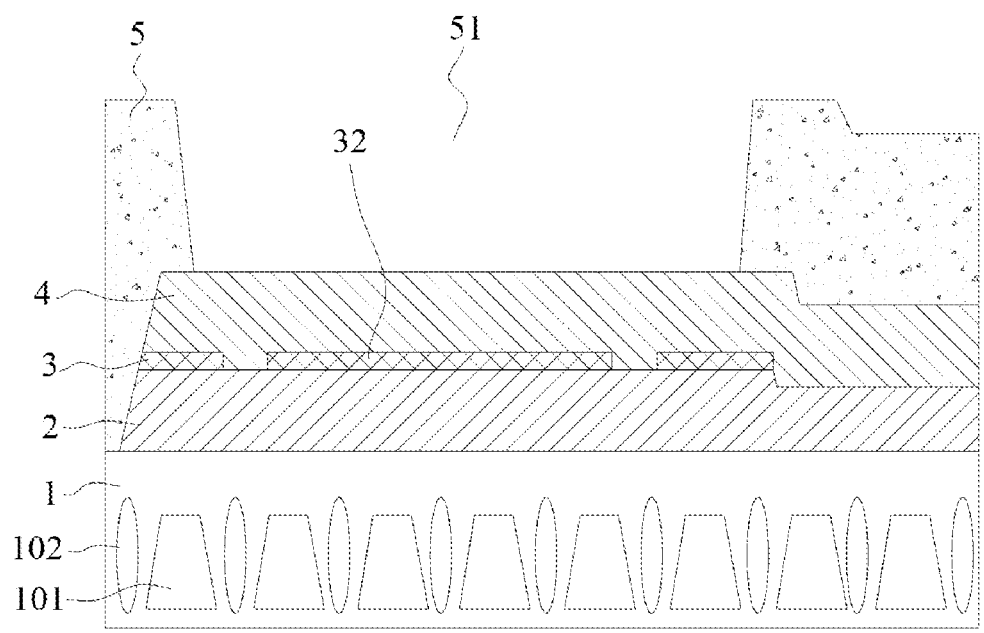
FIG. 2 is a schematic diagram of an RDL structure in an embodiment of the present disclosure.

As shown in FIG. 2, the RDL structure in this embodiment of the present disclosure may include a substrate 1, a first conductive layer 2, a reinforcement layer 3, and a second conductive layer 4.

The first conductive layer 2 may be formed on the substrate 1 and have a first bond pad area.

The reinforcement layer 3 may be formed on a surface of the first conductive layer 2 facing away from the substrate 1, and located in the first bond pad area.

The second conductive layer 4 may cover the reinforcement layer 3 and an area of the first conductive layer 2 not covered by the reinforcement layer 3.

The reinforcement layer 3 may be made of a conductive material, and the material may have a strength greater than those of the first conductive layer 2 and the second conductive layer 4.

Figure 3:
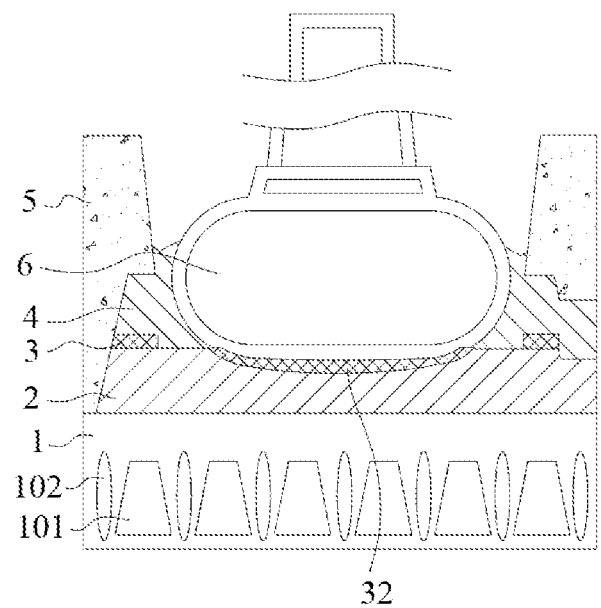
FIG. 3 is a schematic diagram of an RDL structure during wire bonding in an embodiment of the present disclosure.

According to the RDL structure provided by this embodiment of the present disclosure, the reinforcement layer 3 may have a strength that is greater than those of the first conductive layer 2 and the second conductive layer 4. As shown in FIG. 3, the reinforcement layer 3 may buffer the impact of the bond ball 6 during the wire bonding. Therefore, the capability of the RDL to resist the impact of the bond ball 6 is improved, and the circuit short caused by the impact is prevented. Furthermore, because of the presence of the reinforcement layer 3, the thicknesses of the first conductive layer 2 and the second conductive layer 4 may be reduced. Thus, under the premise of guaranteeing the impact resistance, the thickness of the RDL can be reduced, the parasitic capacitance effect is lowered, and the performance of the semiconductor device using the RDL structure is improved.

Each part of the RDL structure in this embodiment of the present disclosure will be described below in detail.

As shown in FIG. 2, the substrate 1 may be a dielectric layer. The dielectric layer may include a plurality of electronic devices 101 spaced apart. Each electronic device 101 may be, but not limited to, a transistor, a bottom conductive layer, or a wire, etc. Two adjacent electronic devices 101 may be spaced apart by an air gap 102, wherein the air gap 102 may be a cavity in the substrate 1. Certainly, the substrate 1 may include other structures which are not described herein.

As shown in FIG. 2, the first conductive layer 2 may be formed on a surface of the substrate 1, and may be made of aluminum. Certainly, the first conductive layer 2 may also be made of other conductive metals or nonmetal materials. The first conductive layer 2 may have a first bond pad area. During the wire bonding, such as the pressure bonding, the first bond pad area is an area of the first conductive layer 2 right directed to the bond ball 6.

Figure 10:
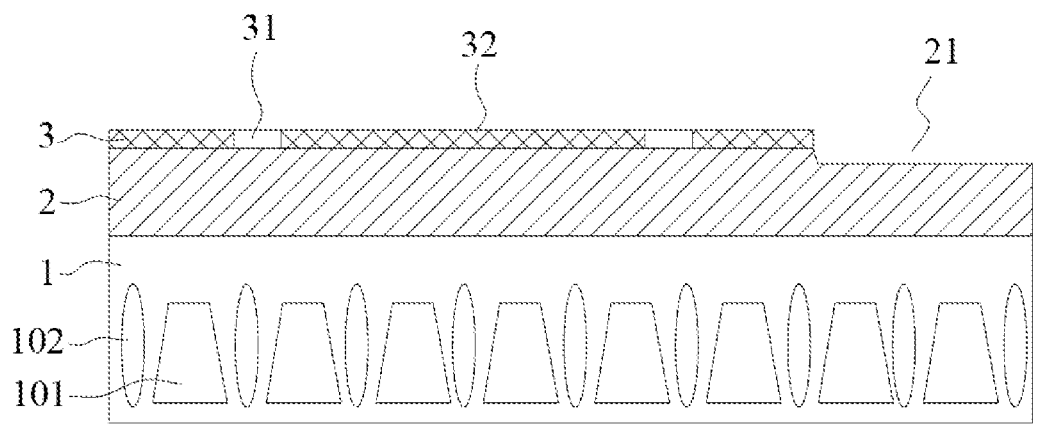
FIG. 10 is a schematic diagram of an RDL structure upon the completion of step S1320 in FIG. 7.

As shown in FIG. 2 and FIG. 10, a first sunken portion 21 sinking towards the substrate 1 may be formed on a surface of the first conductive layer 2 facing away from the substrate 1. The first sunken portion 21 is located out of the first bond pad area and covers the substrate 1.

As shown in FIG. 2, the reinforcement layer 3 may be formed on the surface of the first conductive layer 2 facing away from the substrate 1, and located in the first bond pad area. The first bond pad area may be an area covered by the reinforcement layer 3 on the first conductive layer 2. The reinforcement layer 3 has a material strength greater than that of the first conductive layer 2, and the material of the reinforcement layer 3 may include at least one of metals and metal nitrides. For example, the first conductive layer 2 may be made of aluminum, and the material of the reinforcement layer 3 may include at least one of tungsten, titanium, tantalum, titanium nitride, and tantalum nitride. Certainly, the reinforcement layer 3 may be made of other materials.

Figure 4:
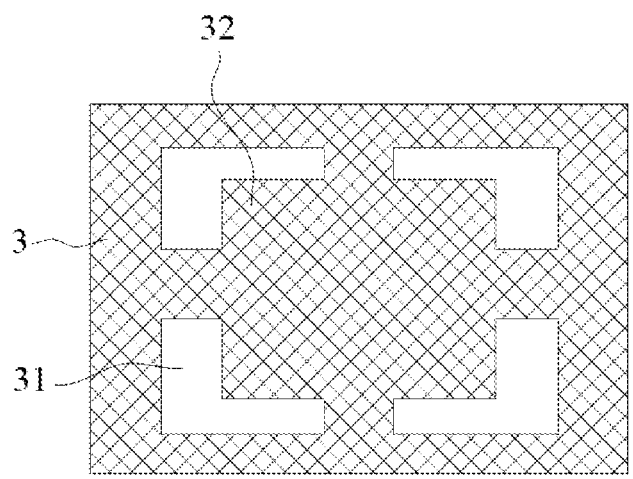
FIG. 4 is a top view of a reinforcement layer of an RDL structure in an embodiment of the present disclosure.

In order to lower a resistance capacitance (RC) delay effect, as shown in FIG. 4, the reinforcement layer 3 may have one, two, or more first through vias 31. Under the premise of that the strength of the reinforcement layer is guaranteed, the area of the reinforcement layer 3 may be reduced, the RC delay effect may be lowered, and the performance of the circuit may be improved. When a plurality of first through vias 31 are provided, the plurality of first through vias 31 may be distributed at intervals along an annular track. The first through via 31 may be of an L shape, a circular shape, a rectangular shape, or other shapes, which will not be listed one by one herein.

In an embodiment of the present disclosure, as shown in FIG. 4, four first through vias 31 are provided, each first through via 31 is of an L shape and has a width ranging from 0.3 µm to 10 µm. Under the premise of that the strength of the reinforcement layer is guaranteed, the RC delay effect is lowered. Certainly, the width of each first through via 31 may also be smaller than 0.3 µm or greater than 10 µm. The four first through vias 31 may be distributed at intervals along an annular track, wherein the annular track may be of a rectangular shape. The first through vias 31 may be distributed annularly to divide the reinforcement layer 3 into a peripheral portion and a buffer portion 32, wherein the peripheral portion is disposed around the buffer portion 32, and connected to the buffer portion 32 via sections between adjacent first through vias 31. As shown in FIG. 3, during the pressure bonding, the bond ball 6 may be right directed to the buffer portion 32, and an orthographic projection of the bond ball 6 on the reinforcement layer 3 may be located in an area enclosed by the first through vias 31, so that the impact of the bond ball 6 may be buffered by the buffer portion 32 of the reinforcement layer 3. As the buffer portion 32 is connected to the peripheral portion via the sections between the adjacent first through vias 31, the buffer portion 32 may deform easily but not be broken, and thus the capability of buffering the impact is improved.

As shown in FIG. 2, the second conductive layer 4 may cover the reinforcement layer 3 and an area of the first conductive layer 2 not covered by the reinforcement layer 3. The second conductive layer 4 may be made of the conductive material that has a strength smaller than that of the reinforcement layer 3. The material of the second conductive layer 4 may be the same as that of the first conductive layer 2, for example, both the first conductive layer 2 and the second conductive layer 4 may be made of aluminum. Certainly, the second conductive layer 4 may also be made of other conductive metals or nonmetal materials. When the reinforcement layer 3 has the first through vias 31, the second conductive layer 4 may fill the first through vias 31 and be connected to the first conductive layer 2.

Figure 5:
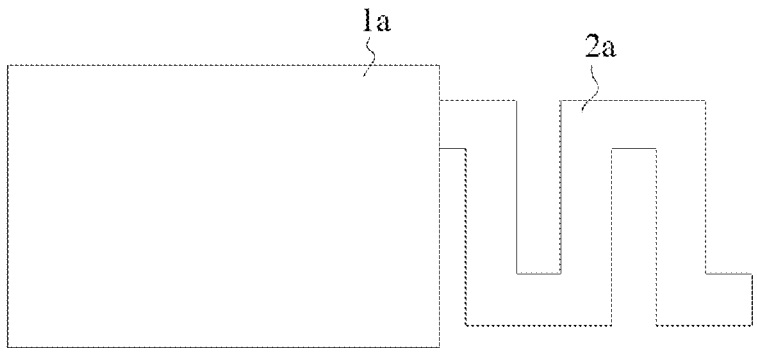
FIG. 5 is a schematic diagram of a bond pad portion and a wire portion of an RDL structure in an embodiment of the present disclosure.
Figure 11:
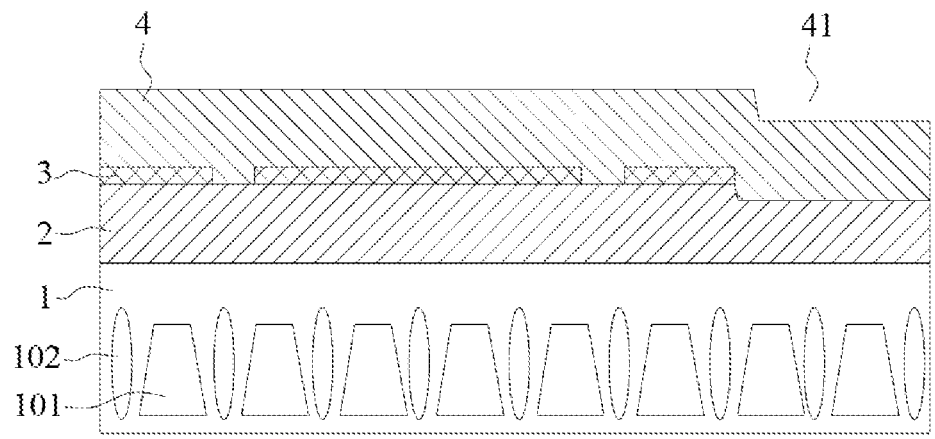
FIG. 11 is a schematic diagram of an RDL structure upon the completion of step S140 in FIG. 6.

The second conductive layer 4 may have a second bond pad area and a second sunken portion 41, as shown in FIG. 11, and the second bond pad area may be right directed to the reinforcement layer 3. Specifically, the second bond pad area is an area of the second conductive layer 4 covering the reinforcement layer 3. The first bond pad area of the first conductive layer 2, the reinforcement layer 3, and the second bond pad area of the second conductive layer 4 may be formed in a laminated manner to form a bond pad portion of the RDL structure. The second sunken portion 41 is located out of the second bond pad area, sinks towards the first conductive layer 2, and may sink into the first sunken portion 21. During manufacturing, if the first conductive layer 2 has the first sunken portion 21, when the second conductive layer 4 is formed, the second conductive layer 4 may fill a part of the first sunken portion 21 to form the second sunken portion 41 accordingly, to avoid using an etching or other processes for forming the second sunken portion 41 on the second conductive layer 4. The first sunken portion 21 and the second sunken portion 41 are in a laminated manner, and may form the wire portion connected to the bond pad portion. The wire portion may extend along a preset track. The preset track may be a straight line, a curve, a polyline, or the like, which is not defined particularly herein. The shapes and structures of the bond pad portion and the wire portion may be as shown in FIG. 5. In FIG. 5, the bond pad portion 1a may be of a rectangular structure, and the wire portion 2a may extend along a polyline and is connected to the bond pad portion 1a. Certainly, the structure in FIG. 5 is merely an example for illustration and does not construe a limitation to the RDL structure.

The second sunken portion 41 may be as deep as the first sunken portion 21. For example, the depth of the second sunken portion 41 may range from 0.05 μm to 0.5 μm, and may be smaller than 0.05 μm or greater than 0.5 μm. During the pressure bonding, the bond ball 6 impacts the second conductive layer 4, so that the second conductive layer 4 may be squeezed outwards and the second sunken portion 41 may provide a space for the movement of the material, such that the material of the second conductive layer 4 is squeezed out.

Additionally, as shown in FIG. 2, edges of orthographic projections of the first conductive layer 2, the reinforcement layer 3, and the second conductive layer 4 on the substrate 1 are within an edge of the substrate 1. The edges of the first conductive layer 2, the reinforcement layer 3, and the second conductive layer 4 keep a certain distance from the edge of the substrate 1, so that spaces are provided for the movement of the first conductive layer 2, the reinforcement layer 3, and the second conductive layer 4 during the pressure bonding. Certainly, the edges of the first conductive layer 2, the reinforcement layer 3, and the second conductive layer 4 may also be flush with the edge of the substrate 1.

As shown in FIG. 2, the RDL structure in this embodiment of the present disclosure may further include a passivation layer 5. The passivation layer 5 may cover at least a portion of a surface of the second conductive layer 4 facing away from the first conductive layer 2. The passivation layer 5 may be made of a corrosion-resistant insulation material such as silicon oxide, phosphosilicate glass, or polyimide. The passivation layer 5 may also be made of silicon nitride or silicon oxynitride. The passivation layer 5 has a second through via 51. The second through via 51 may expose an area of the second conductive layer 4 right directed to the reinforcement layer 3, that is, a second bond pad area. The second through via 51 may provide a space for the bond ball 6 during the pressure bonding. If the edges of the orthographic projections of the first conductive layer 2, the reinforcement layer 3, and the second conductive layer 4 on the substrate 1 are within the edge of the substrate 1, the passivation layer 5 may cover exposed areas of sidewalls of the first conductive layer 2, the reinforcement layer 3, and the second conductive layer 4.

Figure 6:
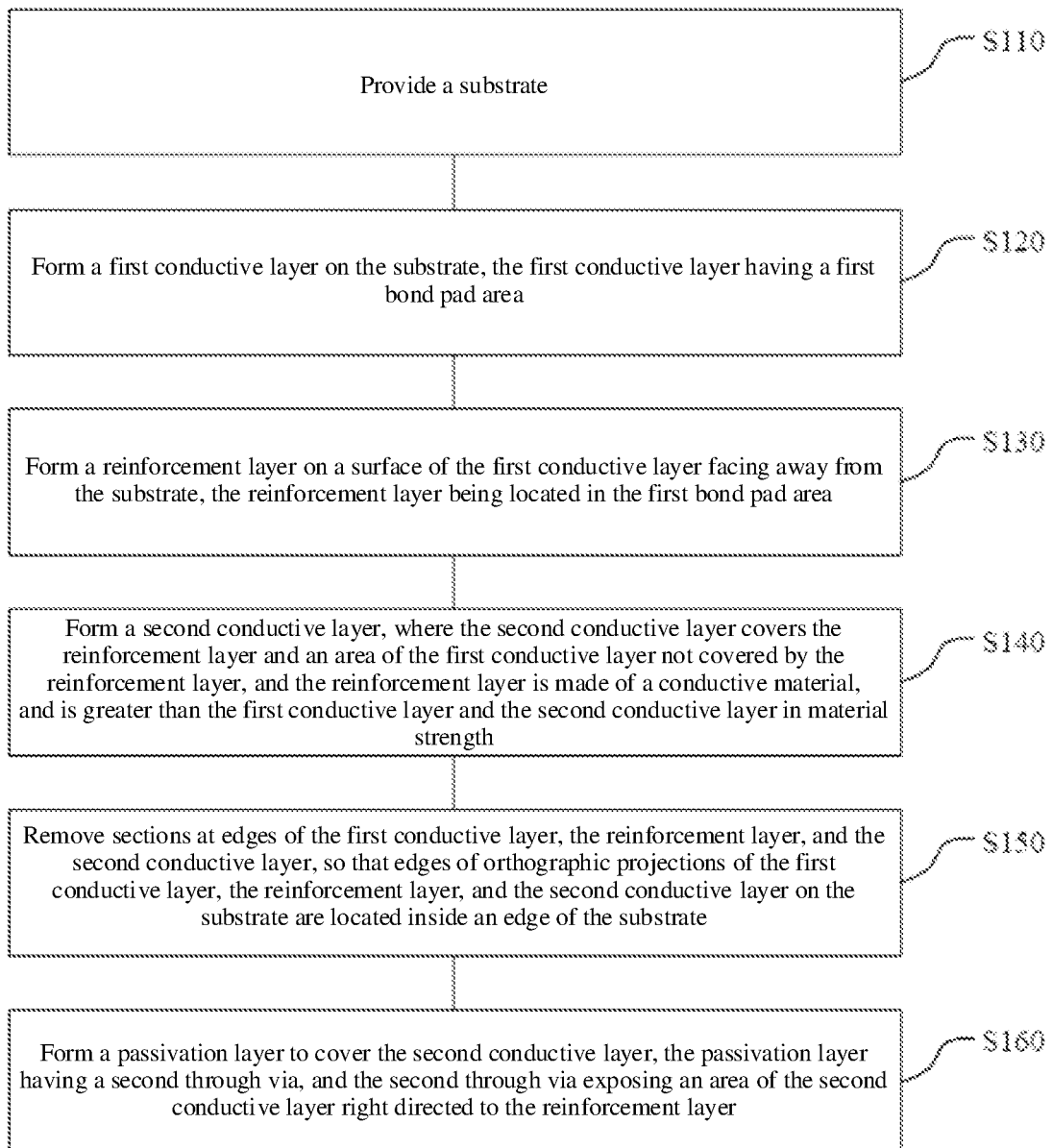
FIG. 6 is a flowchart of a manufacturing method of a RDL structure in an embodiment of the present disclosure.

An embodiment of the present disclosure further provides a manufacturing method of an RDL structure. As shown in FIG. 6, the manufacturing method may include the following steps.

In step S110, a substrate may be provided.

In step S120, a first conductive layer may be formed on the substrate, and the first conductive layer may have a first bond pad area.

In step S130, a reinforcement layer may be formed on a surface of the first conductive layer facing away from the substrate, the reinforcement layer is located in the first bond pad area.

In step S140, a second conductive layer is formed, the second conductive layer covers the reinforcement layer and an area of the first conductive layer not covered by the reinforcement layer.

The reinforcement layer may be made of a conductive material that has a material strength greater than those of the first conductive layer and the second conductive layer.

Each step of the manufacturing method in this embodiment of the present disclosure will be described below in detail.

In step S110, a substrate is provided.

Figure 8:
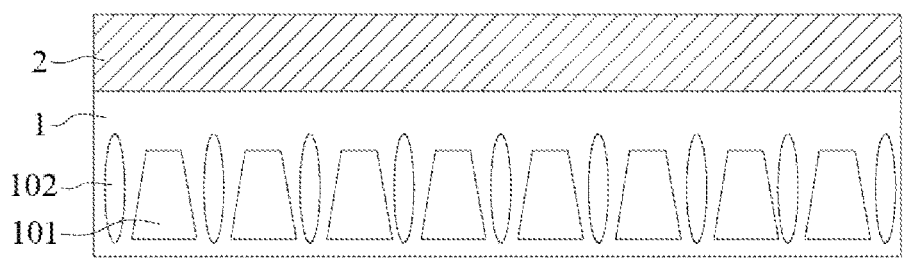
FIG. 8 is a schematic diagram of an RDL structure upon the completion of step S120 in FIG. 6.

As shown in FIG. 8, the substrate 1 may be a dielectric layer. The dielectric layer may include a plurality of electronic devices 101 spaced apart. Each electronic device may be a transistor, a bottom conductive layer, or the like. Two adjacent electronic devices may be separated by an air gap 102. Certainly, the substrate 1 may be other structures and is not limited herein.

In step S120, a first conductive layer is formed on the substrate. The first conductive layer has a first bond pad area.

As shown in FIG. 8, the first conductive layer 2 may be made of aluminum, or other conductive metals or nonmetal materials. The first conductive layer 2 may have a first bond pad area. During the pressure bonding, the first bond pad area is an area of the first conductive layer 2 right directed to the bond ball 6.

In step S130, a reinforcement layer is formed on a surface of the first conductive layer facing away from the substrate, wherein the reinforcement layer is located in the first bond pad area.

As shown in FIG. 10 and FIG. 4, the reinforcement layer 3 may be formed on the surface of the first conductive layer 2 facing away from the substrate 1, and located in the first bond pad area. The first bond pad area may be an area of the first conductive layer 2 covered by the reinforcement layer 3. The reinforcement layer 3 may have a material strength greater than that of the first conductive layer 2, and the material of the reinforcement layer 3 may include at least one of metals and metal nitrides. For example, the first conductive layer 2 may be made of aluminum, and the material of the reinforcement layer 3 may include at least one of tungsten, titanium, tantalum, titanium nitride, and tantalum nitride. Certainly, the reinforcement layer 3 may be made of other materials.

As shown in FIG. 4, in order to lower the RC delay effect, the reinforcement layer 3 may have one, two, or more first through vias 31, so that under the premise of that the strength is guaranteed, the area of the reinforcement layer 3 may be reduced, the RC delay effect may be lowered, and the performance of the circuit may be improved. If a plurality of first through vias 31 are provided, the plurality of first through vias 31 may be distributed at intervals along an annular track. The first through vias 31 may be of an L shape, a circular shape, a rectangular shape, or other shapes. The reinforcement layer 3 has been described in the above embodiments of the RDL structure, and will not be repeated herein.

As shown in FIG. 10, a first sunken portion 21 sinking towards the substrate 1 may be on a surface of the first conductive layer 2 facing away from the substrate 1. The first sunken portion 21 is located out of the first bond pad area and covers the substrate 1.

Figure 7:
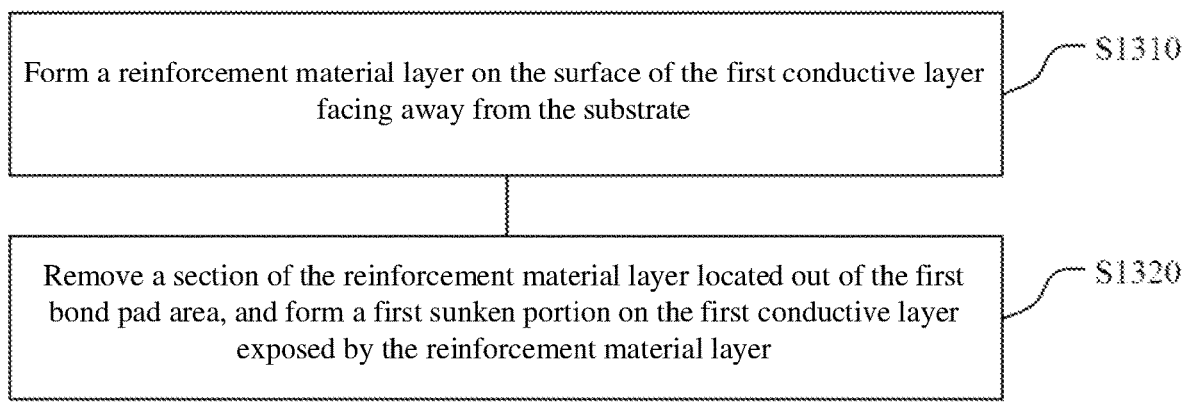
FIG. 7 is a flowchart of step S130 of the manufacturing method in FIG. 6.

In one embodiment of the present disclosure, as shown in FIG. 7, step S130 may include the following steps.

In step S1310, a reinforcement material layer may be formed on the surface of the first conductive layer facing away from the substrate.

Figure 9:
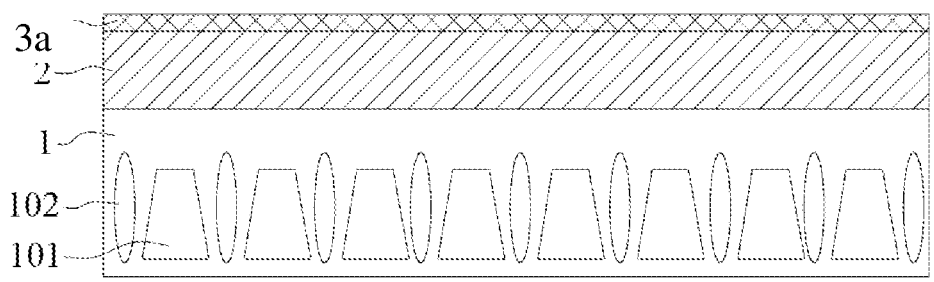
FIG. 9 is a schematic diagram of an RDL structure upon the completion of step S1310 in FIG. 7.

As shown in FIG. 9, the material of the reinforcement material layer 3a is the material of the reinforcement layer 3, and will not be described in detail herein. The reinforcement material layer 3a may be formed on the surface of the first conductive layer 2 facing away from the substrate 1, and the reinforcement material layer 3a may cover the first conductive layer 2 completely. The material of the reinforcement material layer 3a is the material of the reinforcement layer 3.

In step S1320, a section of the reinforcement material layer 3a located out of the first bond pad area may be removed, and a first sunken portion is formed on the first conductive layer 2 exposed by the reinforcement material layer 3a. In an embodiment of the present disclosure, a section of the first conductive layer 2 may also be removed to form the first sunken portion.

As shown in FIG. 10, the section of the reinforcement material layer 3a located out of the first bond pad area in FIG. 9 may be removed via a lithography process, and the first sunken portion 21 is formed on the first conductive layer 2 exposed by the reinforcement layer 3. The lithography process may include the steps of coating a photoresist, exposing, developing, etching, stripping, and the like, and will not be described in detail herein. The etching step may include dry etching, such as plasma etching.

In step S140, a second conductive layer is formed, wherein the second conductive layer covers the reinforcement layer and an area of the first conductive layer not covered by the reinforcement layer.

As shown in FIG. 11, the second conductive layer 4 may be made of the conductive materials having the strength smaller than that of the reinforcement layer 3. The material of the second conductive layer 4 may be the same as that of the first conductive layer 2, for example, both the first conductive layer 2 and the second conductive layer 4 may be made of aluminum. Certainly, the second conductive layer 4 may also be made of other conductive metals or nonmetal materials. For the reinforcement layer 3 with the first through vias 31, the second conductive layer 4 may fill the first through vias 31 and is connected to the first conductive layer 2. The reinforcement layer 3 may be made of the conductive materials, and have a material strength that is greater than those of the first conductive layer and the second conductive layer.

For the first conductive layer 2 with the first sunken portion 21, when the second conductive layer 4 is formed, the section of the second conductive layer 4 at a position of the first sunken portion 21 may sink into the first sunken portion 21 to form the second sunken portion 41 on the second conductive layer 4 accordingly. The second sunken portion 41 may be as deep as the first sunken portion 21. For example, the depth of the second sunken portion 41 may range from 0.05 μm to 0.5 μm, and may also be smaller than 0.05 μm or greater than 0.5 μm. During the pressure bonding, the bond ball 6 impacts the second conductive layer 4. The second conductive layer 4 may be squeezed outwards, and the second sunken portion 41 may provide a space for the movement of the second conductive layer 4.

Figure 12:
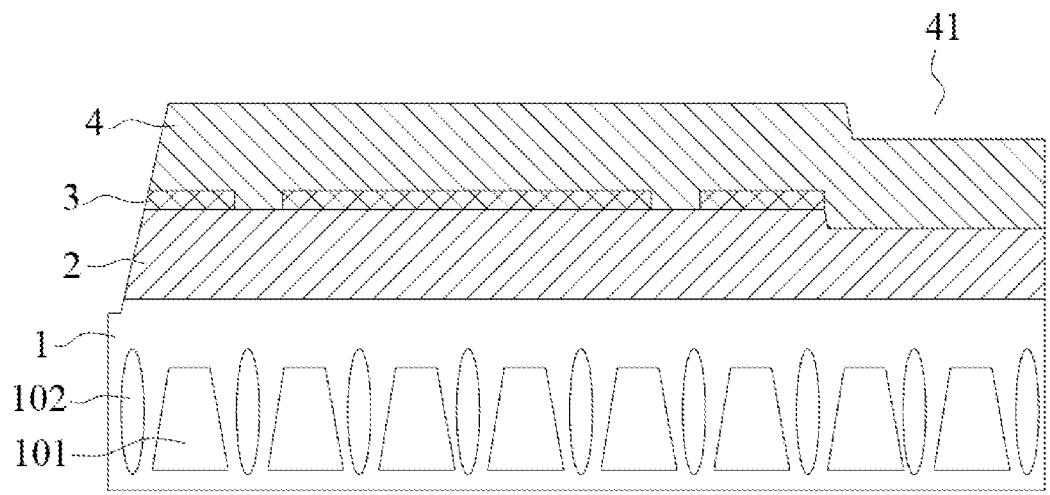
FIG. 12 is a schematic diagram of an RDL structure upon the completion of step S150 in FIG. 6.

On the basis of step S110 to step S140, as shown in FIG. 6 and FIG. 12, the manufacturing method in this embodiment of the present disclosure may further include the following steps.

In step S150, sections at edges of the first conductive layer, the reinforcement layer, and the second conductive layer may be removed, so that edges of orthographic projections of the first conductive layer, the reinforcement layer, and the second conductive layer on the substrate are located inside an edge of the substrate.

On the basis of step S110 to step S150, as shown in FIG. 12, the manufacturing method in this embodiment of the present disclosure may further include the following steps.

In step S160, a passivation layer is formed to cover at least a portion of the second conductive layer, the passivation layer may have a second through via, and the second through via exposes an area of the second conductive layer right directed to the reinforcement layer.

The passivation layer 5 may cover at least a portion of a surface of the second conductive layer 4 facing away from the first conductive layer 2. The passivation layer 5 may be made of corrosion-resistant insulation materials such as silicon oxide, phosphorosilicate glass, or polyimide. The passivation layer 5 may also be made of silicon nitride or silicon oxynitride. The second through via 51 of the passivation layer 5 may expose an area of the second conductive layer 4 right directed to the reinforcement layer 3, that is, a second bond pad area. The second through via 51 may provide a space for the bond ball 6 during the pressure bonding. Meanwhile, the passivation layer 5 may cover exposed areas of sidewalls of the first conductive layer 2, the reinforcement layer 3, and the second conductive layer 4.

An embodiment of the present disclosure further provides a semiconductor device manufacturing method and a semiconductor device, which may include the RDL structure described in the above embodiments. The semiconductor device may be an independent chip, such as a memory chip, and an integrated circuit including a plurality of chips and the like. The semiconductor device may include an RDL structure of the embodiments of the present disclosure, which will not be described repeatedly herein. Furthermore, the benefits of the semiconductor device may include the benefits of the RDL structure described in the above embodiments, and will not be repeated herein.

It is to be noted that although steps of the manufacturing method of the present disclosure are described in the accompanying drawings in a particular sequence, it is not required or suggested that these steps must be executed in the particular sequence, or all illustrated steps must be executed to achieve the desired result. Additionally or alternatively, some steps may be omitted, a plurality of steps may be combined into one step for execution, and/or one step may be decomposed into a plurality of steps for execution, etc.

Other embodiments of the present disclosure will be obvious to the person skilled in the art from consideration of the specification and practice of the present disclosure disclosed herein. The present disclosure covers any variations, uses, or adaptations of the present disclosure following the general principles thereof and including such departures from the present disclosure as come within known or customary practice in the art. The specification and embodiments are considered as being exemplary only. The true scope and spirit of the present disclosure are indicated by the appended claims.

What is claimed is:

1. A redistribution layer (RDL) structure, comprising:
    a substrate;
    a first conductive layer formed on the substrate and having a first bond pad area;
    a reinforcement layer formed on a surface of the first conductive layer not adjacent to the substrate and located in the first bond pad area; and
    a second conductive layer formed on the reinforcement layer and an area of the first conductive layer not covered by the reinforcement layer,
    wherein the reinforcement layer has a material strength greater than those of the first conductive layer and the second conductive layer and the reinforcement layer is conductive.

2. The RDL structure according to claim 1, wherein the reinforcement layer has at least one first through via, and the second conductive layer fills the at least one first through via and is connected to the first conductive layer.

3. The RDL structure according to claim 2, wherein the at least one first through via comprises a plurality of first through vias distributed at intervals along an annular track.

4. The RDL structure according to claim 1, wherein a material of the reinforcement layer comprises at least one of metals and metal nitrides.

5. The RDL structure according to claim 1, wherein the material of the reinforcement layer comprises at least one of tungsten, titanium, tantalum, titanium nitride, and tantalum nitride.

6. The RDL structure according to claim 1, wherein edges of orthographic projections of the first conductive layer, the reinforcement layer, and the second conductive layer on the substrate are located inside an edge of the substrate.

7. The RDL structure according to claim 1, wherein:
    the first conductive layer has a first sunken portion located out of the second bond pad area and sinking towards the substrate, the second conductive layer has a second bond pad area and a second sunken portion, the second bond pad area is right directed to the reinforcement layer, and the second sunken portion is located at a position of the first sunken portion and sinks towards the first conductive layer.

8. The RDL structure according to claim 7, wherein a depth of the second sunken portion ranges from 0.05 µm to 0.5 µm.

9. The RDL structure according to claim 1, further comprising:
    a passivation layer covering the second conductive layer and having a second through via, wherein the second through via exposes an area of the second conductive layer right directed to the reinforcement layer.

10. A semiconductor manufacturing method, comprising a redistribution layer (RDL) structure manufacturing method, comprising:
    providing a substrate;
    forming a first conductive layer on the substrate, the first conductive layer having a first bond pad area;
    forming a reinforcement layer on a surface of the first conductive layer facing away from the substrate, the reinforcement layer being located in the first bond pad area; and
    forming a second conductive layer, the second conductive layer covering the reinforcement layer and an area of the first conductive layer not covered by the reinforcement layer,
    wherein the reinforcement layer has a material strength greater than those of the first conductive layer and the second conductive layer and the reinforcement layer is conductive.

11. The RDL structure manufacturing method according to claim 10, wherein the forming the reinforcement layer on the surface of the first conductive layer facing away from the substrate and the reinforcement layer being located in the first bond pad area comprises:
    forming a reinforcement material layer on the surface of the first conductive layer facing away from the substrate;
    removing a section of the reinforcement material layer located out of the first bond pad area; and
    forming a first sunken portion on the first conductive layer exposed by the reinforcement material layer.

12. The RDL structure manufacturing method according to claim 10, wherein the second conductive layer sinks into the first sunken portion at a position of the first sunken portion to form a second sunken portion.

13. The RDL structure manufacturing method according to claim 10, wherein the reinforcement layer has at least one first through via, and the second conductive layer fills the at least one first through via and is connected to the first conductive layer.

14. The RDL structure manufacturing method according to claim 13, wherein the at least one first through via comprises a plurality of first through vias distributed at intervals along an annular track.

15. The RDL structure manufacturing method according to claim 10, wherein a material of the reinforcement layer comprises at least one of metals and metal nitrides.

16. The RDL structure manufacturing method according to claim 15, wherein the material of the reinforcement layer comprises at least one of tungsten, titanium, tantalum, titanium nitride, and tantalum nitride.

17. The RDL structure manufacturing method according to claim 10, further comprising:
    removing sections at edges of the first conductive layer, the reinforcement layer, and the second conductive layer, wherein edges of orthographic projections of the first conductive layer, the reinforcement layer, and the second conductive layer on the substrate are located inside an edge of the substrate.

18. The RDL structure manufacturing method according to claim 10, further comprising:
    forming a passivation layer to cover the second conductive layer, wherein the passivation layer has a second through via, and the second through via exposes an area of the second conductive layer right directed to the reinforcement layer.

19. The RDL structure manufacturing method according to claim 10, wherein the second conductive layer has a second bond pad area, the second bond pad area is right directed to the reinforcement layer, and the second sunken portion is located out of the second bond pad area and sinks towards the first conductive layer.

20. A semiconductor device, comprising a redistribution layer (RDL) structure, wherein the RDL structure comprises:
- a substrate;
- a first conductive layer formed on the substrate and having a first bond pad area;
- a reinforcement layer formed on a surface of the first conductive layer not adjacent to the substrate and located in the first bond pad area; and
- a second conductive layer formed on the reinforcement layer and an area of the first conductive layer not covered by the reinforcement layer, wherein the reinforcement layer has a material strength greater than those of the first conductive layer and the second conductive layer and the reinforcement layer is conductive.

* * * * *